(12) United States Patent
Pagaila et al.

(10) Patent No.: US 7,741,156 B2
(45) Date of Patent: Jun. 22, 2010

(54) SEMICONDUCTOR DEVICE AND METHOD OF FORMING THROUGH VIAS WITH REFLOWED CONDUCTIVE MATERIAL

(75) Inventors: Reza A. Pagaila, Singapore (SG); Linda Pei Ee Chua, Singapore (SG); Byung Tai Do, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 71 days.

(21) Appl. No.: 12/127,417

(22) Filed: May 27, 2008

(65) Prior Publication Data

US 2009/0294914 A1    Dec. 3, 2009

(51) Int. Cl.
*H01L 21/00*    (2006.01)

(52) U.S. Cl. .................. 438/113; 438/109; 257/620; 257/621; 257/E21.505; 257/E23.169

(58) Field of Classification Search ............. 438/109, 438/113; 257/620, 621, E21.505, E23.169
See application file for complete search history.

(56) References Cited

U.S. PATENT DOCUMENTS

| | | | |
|---|---|---|---|
| 6,459,150 B1 | 10/2002 | Wu et al. | |
| 6,479,321 B2 | 11/2002 | Wang et al. | |
| 6,790,775 B2 * | 9/2004 | Fartash | 438/667 |
| 2002/0092894 A1 | 7/2002 | Wang et al. | |
| 2006/0264041 A1 * | 11/2006 | Rigg et al. | 438/667 |

* cited by examiner

*Primary Examiner*—Davienne Monbleau
*Assistant Examiner*—Farid Khan
(74) *Attorney, Agent, or Firm*—Robert D. Atkins

(57) ABSTRACT

A semiconductor device is made by providing a first semiconductor wafer having semiconductor die. A gap is made between the semiconductor die. An insulating material is deposited in the gap. A portion of the insulating material is removed to form a first through hole via (THV). A conductive lining is conformally deposited in the first THV. A solder material is disposed above the conductive lining of the first THV. A second semiconductor wafer having semiconductor die is disposed over the first wafer. A second THV is formed in a gap between the die of the second wafer. A conductive lining is conformally deposited in the second THV. A solder material is disposed above the second THV. The second THV is aligned to the first THV. The solder material is reflowed to form the conductive vias within the gap. The gap is singulated to separate the semiconductor die.

8 Claims, 13 Drawing Sheets

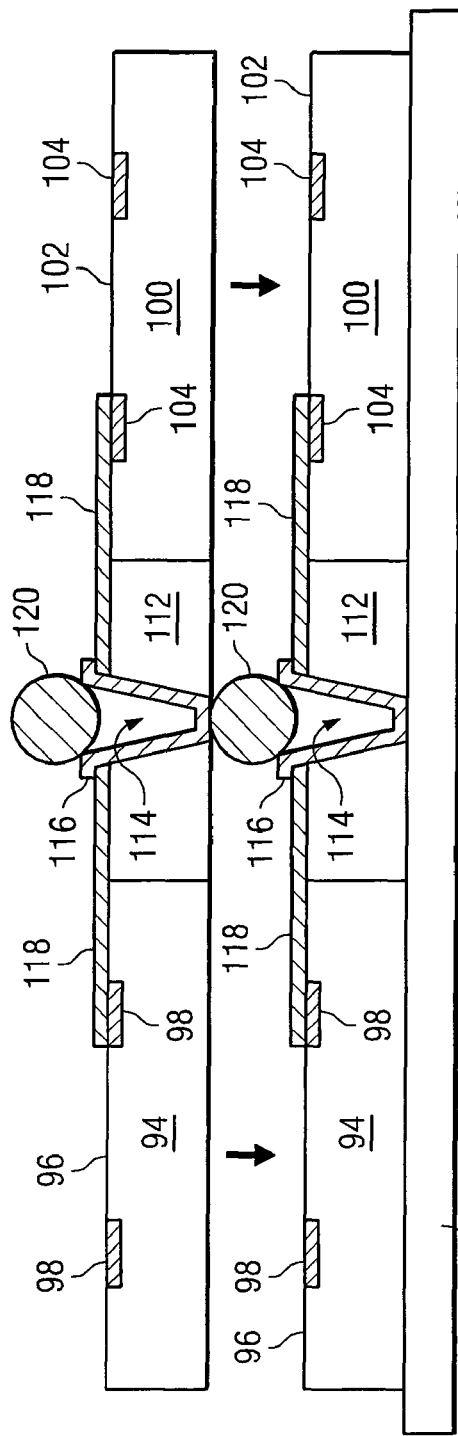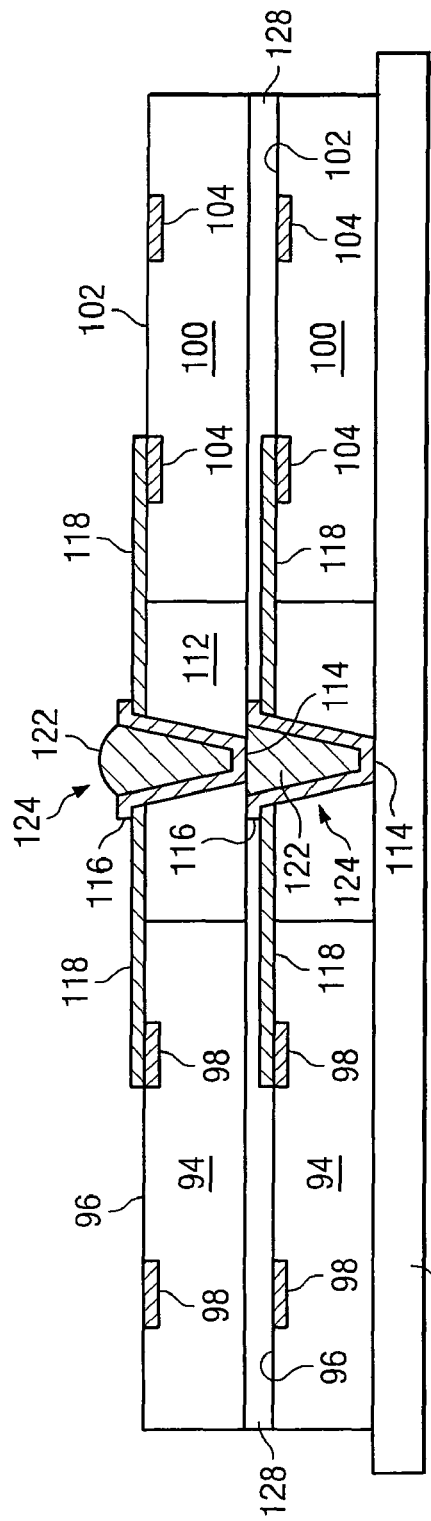

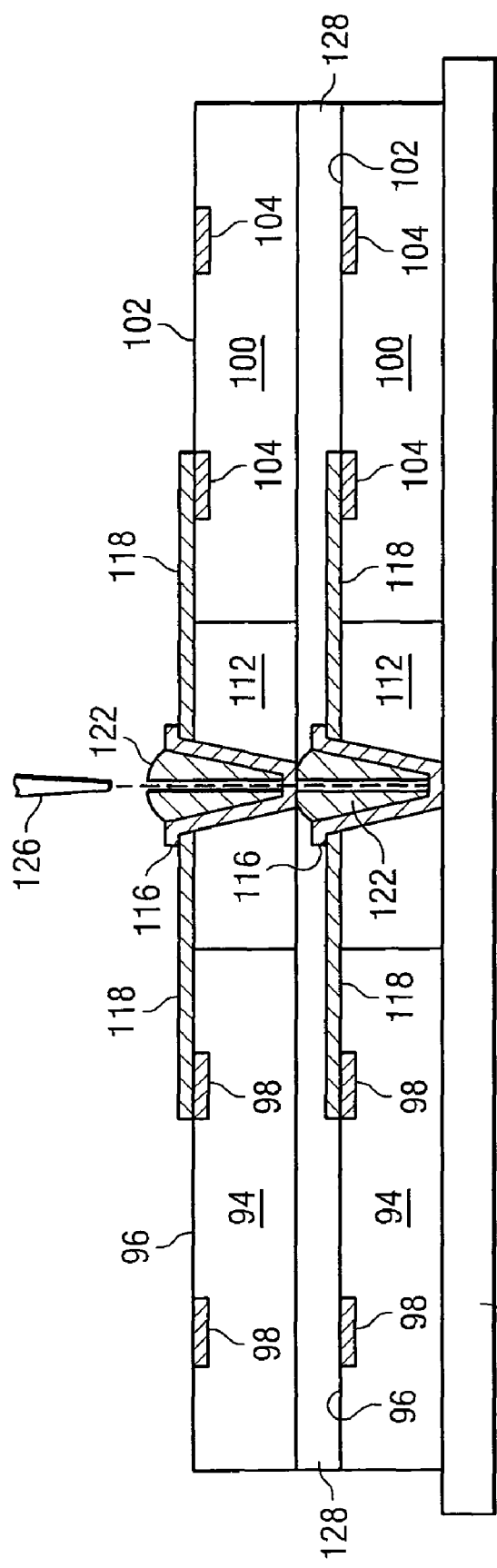
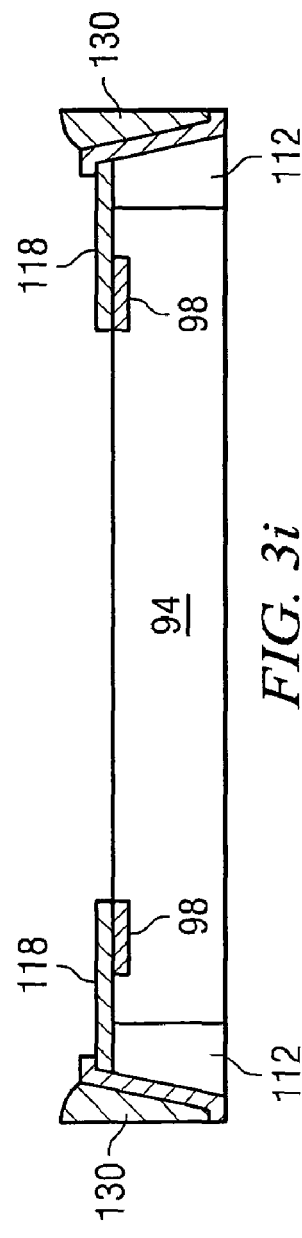
FIG. 3h
FIG. 3i

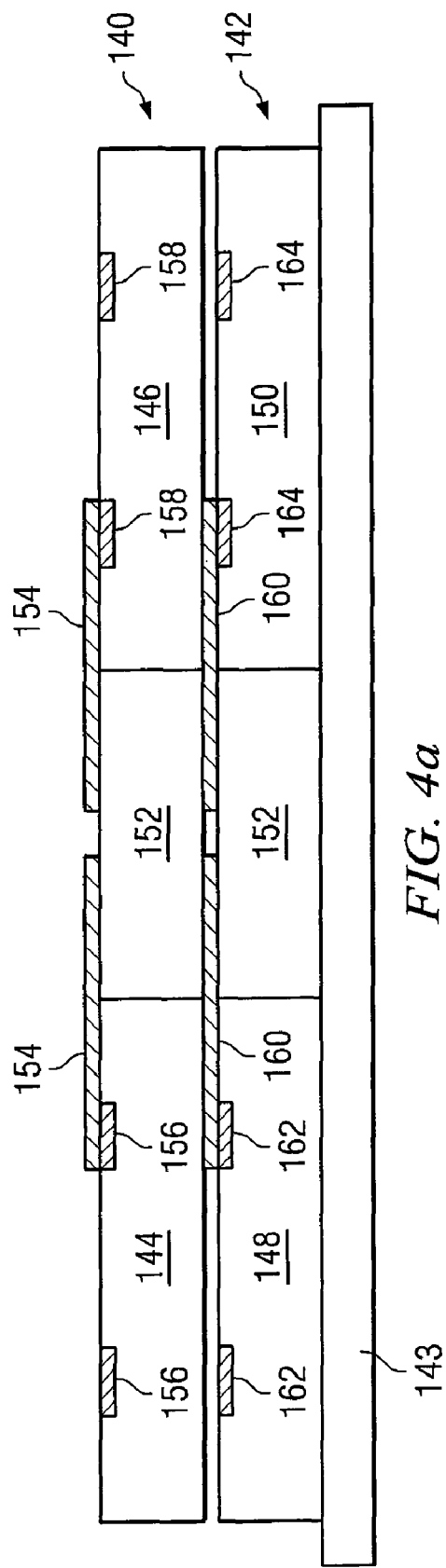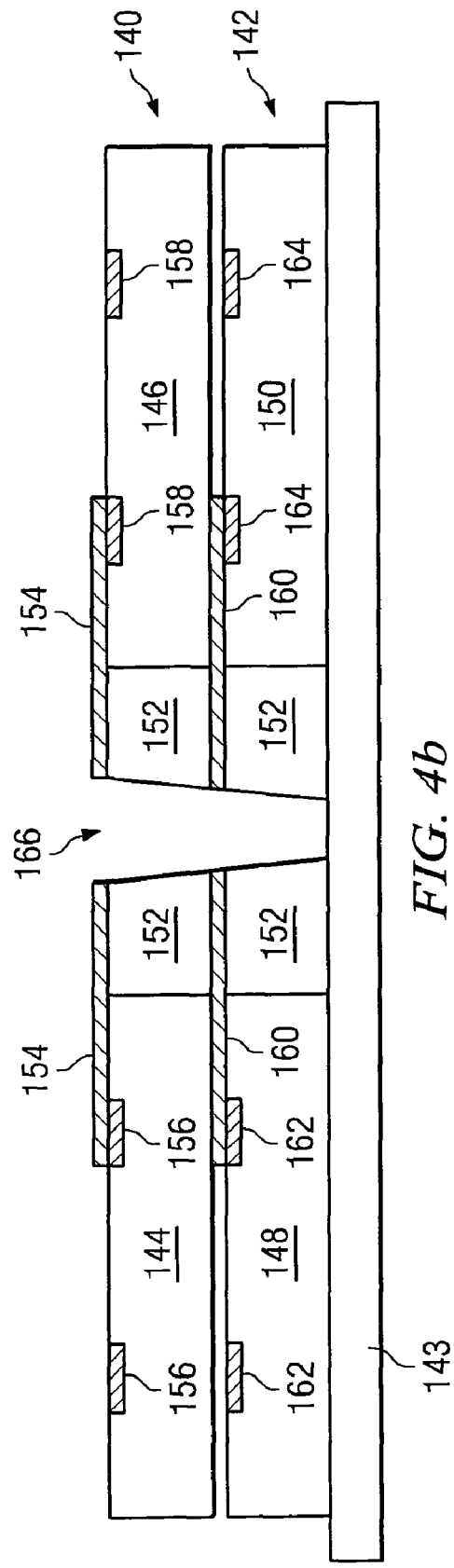

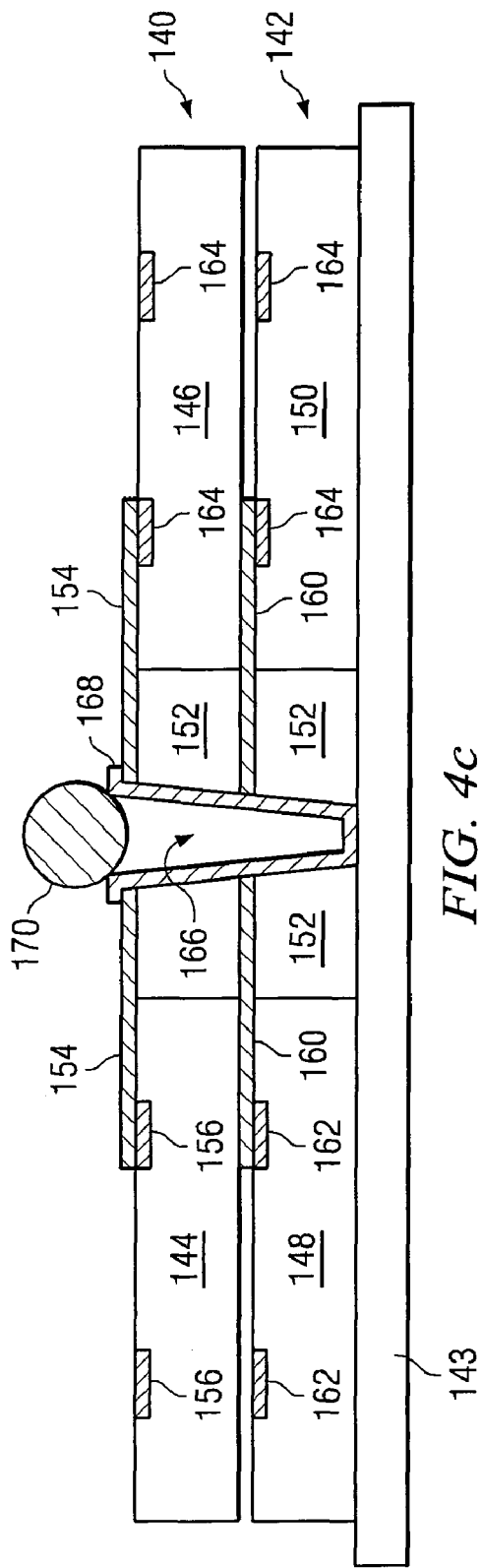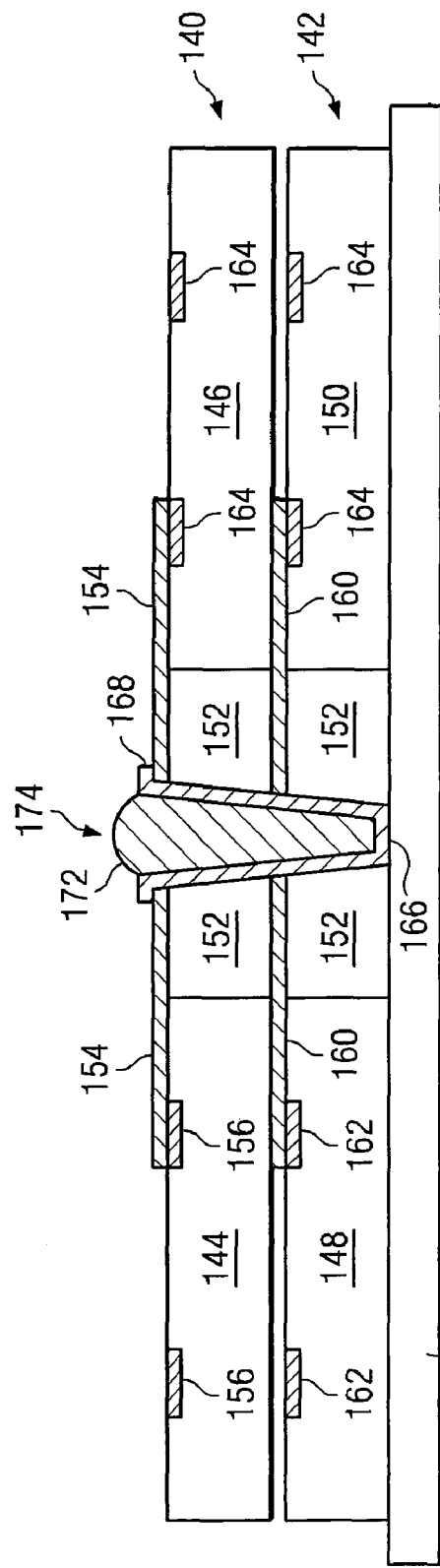

SEMICONDUCTOR DEVICE AND METHOD OF FORMING THROUGH VIAS WITH REFLOWED CONDUCTIVE MATERIAL

FIELD OF THE INVENTION

The present invention relates in general to semiconductor devices and, more particularly, to a semiconductor device having conductive vias formed by reflowing conductive material.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The through hole vias are filled with conductive material. The process of drilling through hole vias in the active area of the die or in saw streets on the wafer can cause damage to the wafer and/or die.

Conventional methods of manufacturing stacked devices having through hole vias (THV) use seed plating, via plating, and bonding to other devices with bonding agents. Complete THV filling often involves significant manufacturing time. Chemical mechanical polishing (CMP) is typically required after via filling step, which contributes to high cost and long production time. Moreover, a bonding process is separately needed after final THV formation. The bonding process involves disposition and reflow of bonding agents and reflow, or thermo-compression bonding. All require additional manufacturing steps.

SUMMARY OF THE INVENTION

A need exists to interconnect stacked semiconductor die with a conductive via having a high aspect ratio and no void within the conductive via. Accordingly, in one embodiment, the present invention is a method of making a semiconductor device comprising the step of providing a first semiconductor wafer having a plurality of semiconductor die. Each semiconductor die has a contact pad. The method further includes the step of creating a gap between the semiconductor die. The gap has sufficient width to form a conductive via within the gap. The method further includes the steps of depositing an insulating material in the gap and forming a conductive layer over the semiconductor die. The conductive layer is electrically connected to the contact pad of the semiconductor die. The method further includes the step of removing a portion of the insulating material to form a through hole via (THV). The method further includes the steps of conforming a conductive lining in the THV, disposing a solder material above the conductive lining of the THV, and reflowing the solder material to form the conductive via within the gap. The conductive via is electrically connected to the conductive layer. The method further includes the step of singulating the first semiconductor wafer through the gap to separate the semiconductor die.

In another embodiment, the present invention is a method of making a semiconductor device comprising the steps of providing a first semiconductor wafer having a plurality of semiconductor die, creating a gap between the semiconductor die, depositing an insulating material in the gap, removing a portion of the insulating material to form a THV, conforming a conductive lining in the THV, disposing a conductive material above the conductive lining of the THV, reflowing the conductive material to form a conductive via within the gap, and singulating the first semiconductor wafer through the gap to separate the semiconductor die.

In another embodiment, the present invention is a method of making a semiconductor device comprising the steps of creating a gap between a plurality of semiconductor die, depositing an insulating material in the gap, removing a portion of the insulating material to form a THV, conforming a conductive lining in the THV, disposing a conductive material above the conductive lining of the THV, and reflowing the conductive material to form a conductive via within the gap.

In another embodiment, the present invention is a semiconductor device comprising a semiconductor die having a peripheral region. A conductive via is formed in a THV in insulating material in the peripheral region. The conductive via has a conductive lining conforming to the THV and a conductive material filling the lining.

BRIEF DESCRIPTION OF THE DRAWINGS

FIGS. 3a-3i illustrate a process of forming conductive vias in the saw street around a periphery of the die;

FIGS. 4a-4f illustrate an alternate process of forming conductive vias in the saw street around a periphery of the die;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
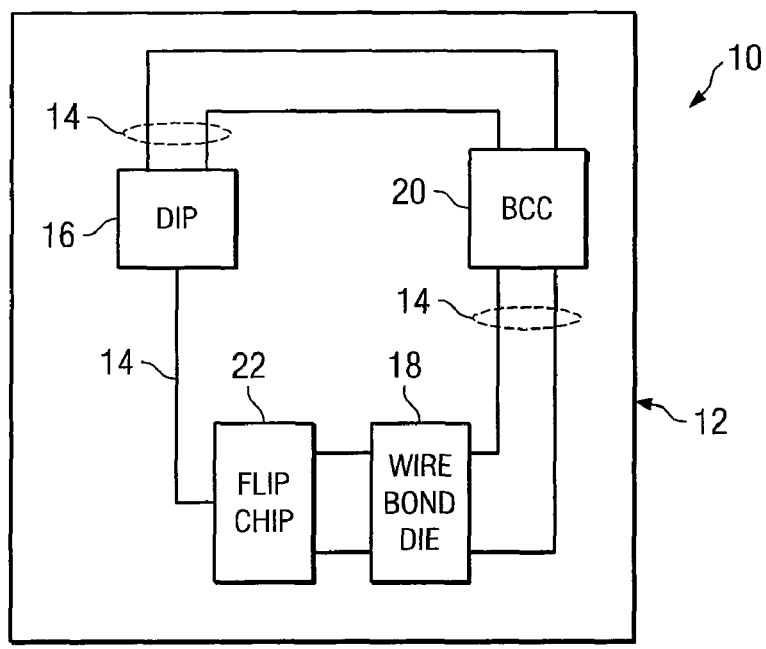
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten manufacturing process. The resulting devices are less likely to fail and less expensive to manufacture resulting in lower costs for consumers.

Figure 2A:
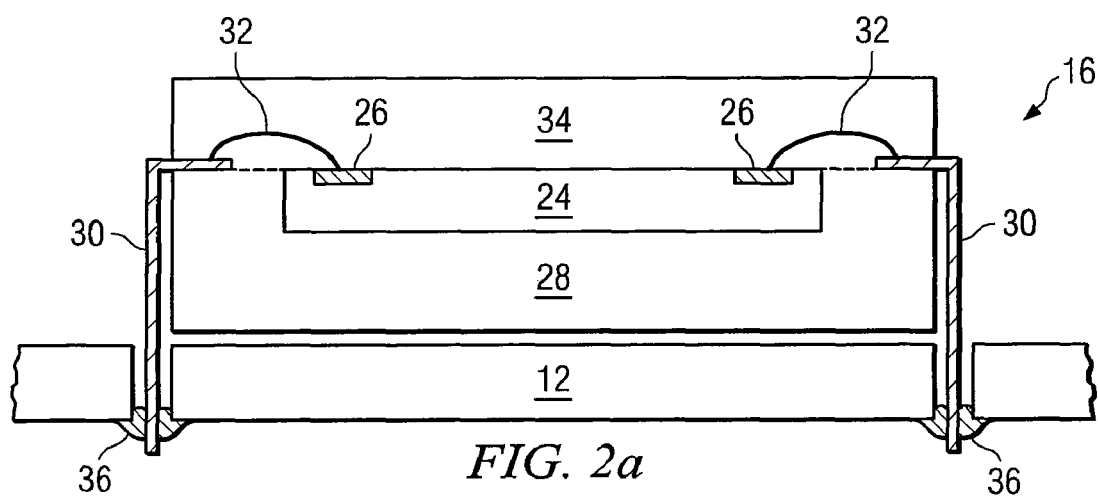
FIGS. 2a-2d illustrates further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and wirebonds 32 are formed between leads 30 and contact pads 26 of die 24. Encapsulant 34 is deposited over the package for environmental protection by preventing moisture and particles from entering the package and contaminating die 24, contact pads 26, or wirebonds 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
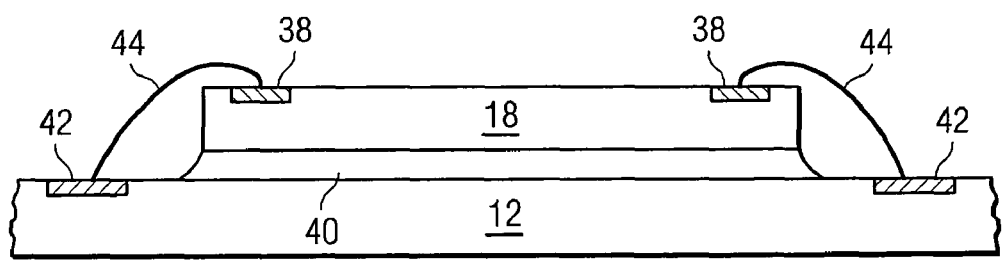

Referring to FIG. 2b, a wire bonded die 18 having contact pads 38 is mounted to PCB 12 using adhesive 40. Contact pads 42 are formed on the surface of PCB 12 and electrically connect to one or more traces 14 formed on or within the layers of PCB 12. Wirebonds 44 are formed between contact pads 38 of die 18 and contact pads 42 of PCB 12.

Figure 2C:
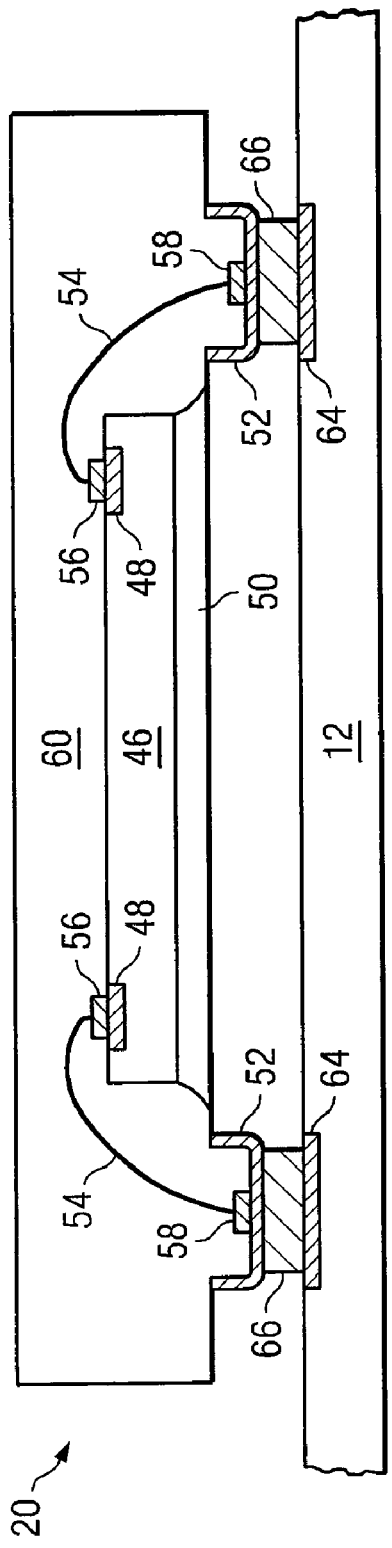

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Wirebonds 54 and bond pads 56 and 58 electrically connect contact pads 48 of die 46 to contact pads 52 of BCC 20. Mold compound or encapsulant 60 is deposited over die 46, wirebonds 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
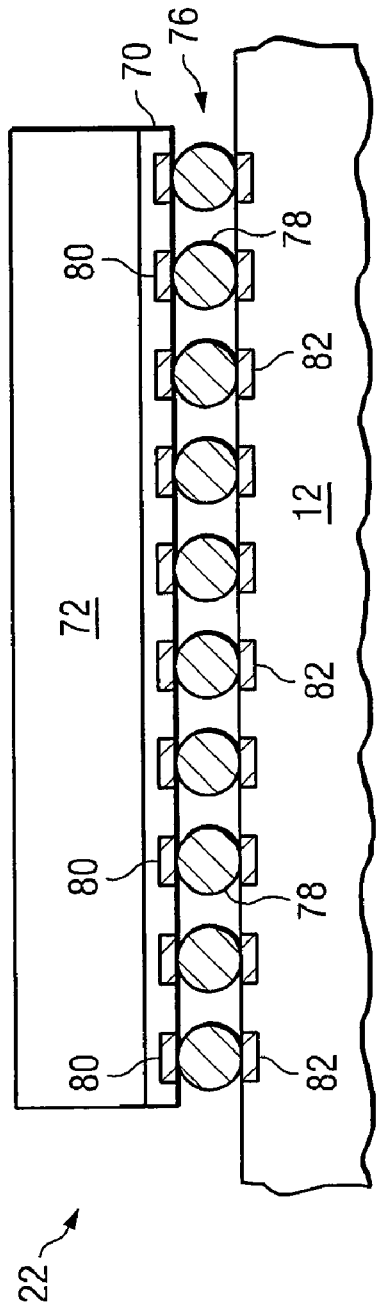

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
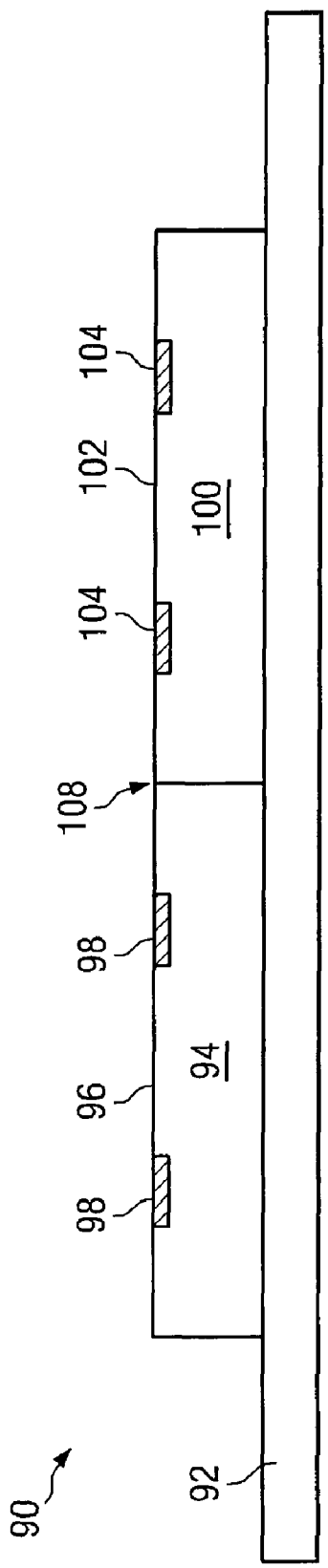

FIGS. 3a-3i illustrate a process of forming conductive vias on a periphery of a semiconductor die in a wafer level chip scale package (WLCSP). To start the process, a plurality of semiconductor die is formed on a semiconductor wafer 90 using conventional integrated circuit processes, as described above. The first semiconductor wafer, containing semiconductor die 94 and 100, is mounted to expansion table 92 with ultraviolet (UV) tape, as shown in FIG. 3a. The backside of semiconductor die 94 is affixed to expansion table 92 with its active surface 96 and contact pads 98 oriented face up. Likewise, the backside of semiconductor die 100 is mounted to expansion table 92 with its active surface 102 and contact pads 104 oriented face up. Contact pads 98 and 104 electrically connect to active and passive devices and signal traces in active areas 96 and 102 of semiconductor die 94 and 100, respectively.

Figure 3B:
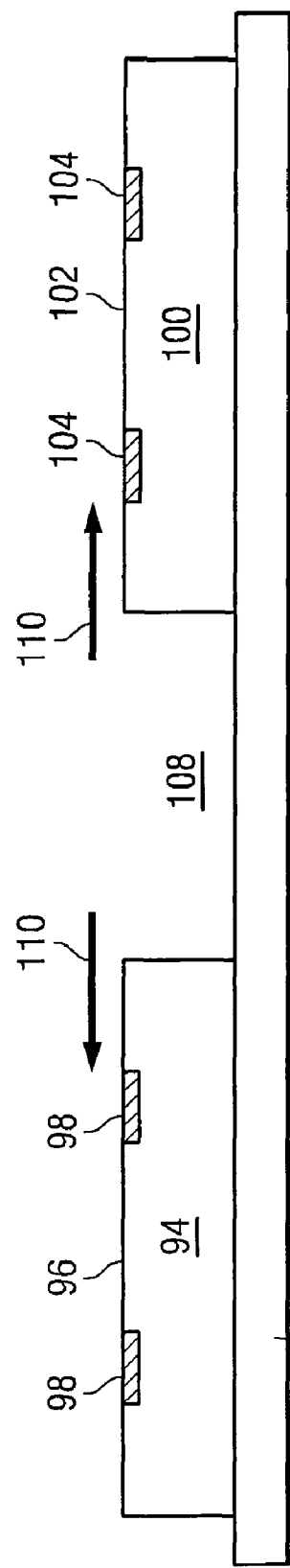

In FIG. 3b, a saw blade or laser tool cuts through saw street 108 of semiconductor die 94 and 100 in a dicing operation. Expansion table 92 moves in two-dimension lateral directions, as shown by arrows 110, to expand the width of saw street 108, i.e., form a gap to create a greater physical separation between the die. Expansion table 92 moves substantially the same distance in the x-axis and y-axis to provide equal separation around a periphery of each die. The post-expansion width of saw street or gap 108 ranges from 5 micrometers (μm) to 200 μm. The expanded dimension depends on the design embodiment, i.e., half-via, full-via, single row via, or double/multiple row via. The expanded saw street or gap 108 define a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form conductive vias within the gap, as described below.

Figure 3C:
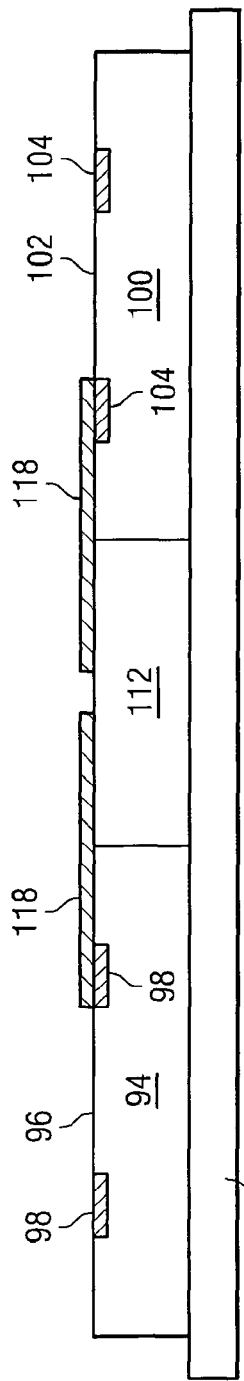

In FIG. 3c, an organic insulating material 112 is deposited in gap 108 using spin coating, needle dispensing, or other suitable application process. Organic material 112 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in gap 108. The non-conductive materials can also be deposited using a transfer molding or injection molding process.

After deposition of organic material 112, the semiconductor die can be removed from the chip carrier and then mounted onto a second carrier.

An electrically conductive material 118 is patterned and deposited on active surface 96 of semiconductor die 94 and active surface 102 of semiconductor die 100 using an evaporation, electrolytic plating, electroless plating, screen printing, or other suitable metal deposition process. The conductive layer 118 can be made with Al, Cu, Sn, Ni, Au, Ag, or other suitable material.

Figure 3D:
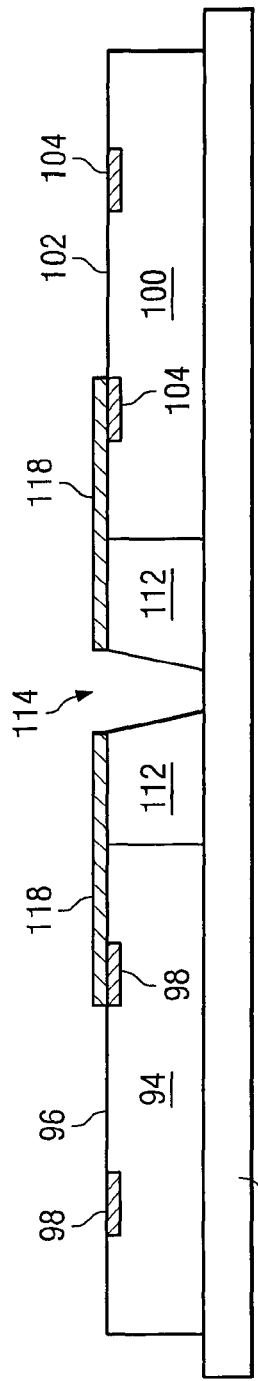

In FIG. 3d, a portion of organic material 112 is removed by laser drilling or etching to create through hole via (THV) 114 extending down to expansion table 92. The walls of the remaining portion of organic material 112, which define THV 114, can be vertical or tapered.

Figure 3E:
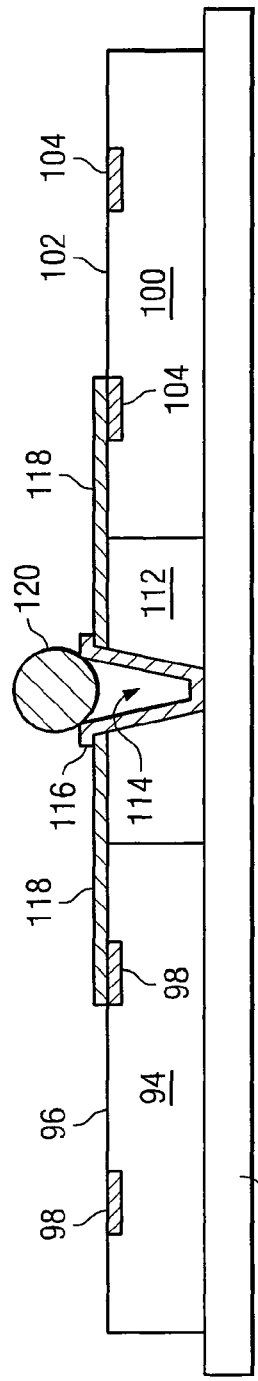

In FIG. 3e, an electrically conductive via lining 116 is conformally deposited along the walls of the remaining portion of organic material 112 and bottom of THV 114. Conductive via lining 116 electrically connects to conductive layer 118. Conductive via lining 116 includes an optional seed layer. The seed layer and conductive via lining 116 are patterned and deposited using a conformal electrolytic plating, electroless plating, CVD, PVD, or other suitable metal deposition process. The seed layer can be made with Cu, Ni, nickel vanadium (NiV), Au, or Al. The conductive via lining 116 can be made with Al, Cu, Sn, Ni, Au, or Ag. The conformal application of the conductive via lining 116 along the walls of the remaining portion of organic material 112 and bottom of THV 114 outlines the conductive via within the gap. The conductive via lining 116 is relatively thin, having a thickness of typically about 2 µm to 50 µm. The conductive layer 118 extends from contact pads 98 and 104 to conductive via lining 116.

An electrically conductive solder bump or ball 120 is deposited over or on top of conductive via lining 116 using pick-and-place, ball drop, solder injection, screen printing, electrolytic plating, electroless plating, CVD, PVD, or other suitable metal deposition process. The solder material can be any metal or electrically conductive material, e.g., Sn, Pb, Ni, Au, Ag, Cu, Bi, and alloys thereof. For example, the solder material can be eutectic Sn/Pb, high lead, or lead free. A flux material may be coated to conductive via lining 116, prior to depositing solder balls 120. The diameter of solder ball 120 is greater than the diameter of THV 114, which ranges from 10-100 µm. Accordingly, solder ball 120 remains on top of THV 114.

In FIG. 3f, a second semiconductor wafer, having undergone the same process described in FIGS. 3a-3e to form conductive via lining 116 in organic material 112 with solder balls 120, is vertically aligned over the first semiconductor wafer. In other words, THV 114 of the first semiconductor wafer is disposed directly over THV 114 of the second semiconductor wafer.

The solder balls 120 are reflowed by heating the solder material above its melting point. The solder material flows into THV 114 by capillary action to fill the THV with conductive material 122, as shown in FIG. 3g. Conductive via lining 116 provides adhesive enhancement for conductive material 122. The conductive material 122 in each semiconductor wafer bonds to adjacent conductive material 122 in the adjacent semiconductor wafer. In some applications, the solder material is reflowed a second time to improve its electrical contact. In addition, pressure can be applied between the first and second semiconductor wafer to force the solder material into THV 114. The combination of conductive materials 116 and 122 constitute a conductive via 124 formed through expanded gap 108 in organic material 112 around a peripheral region of the semiconductor die. An optional underfill material 128 can be disposed between the first and second semiconductor wafer.

Semiconductor die 94 and 100 are singulated in FIG. 3h through a center portion of gap 108, i.e., through a center portion of THV 114 to bisect conductive materials 116 and 122 and create conductive half-vias. The gap region 108 is cut by a cutting tool 126 such as a saw blade or laser. The cutting tool completely severs the gap region to separate the die. The semiconductor die are removed from expansion table 92. FIG. 3i shows semiconductor die 94 with conductive half-vias 130 formed in gap 108 and separated from the die by organic material 112. Semiconductor die 94 can use single layer wiring or build-up interconnect structure to route signals from conductive half-via 130 into the central portion of the device. The conductive layer 118 can be deposited before or after formation of conductive half-via 130.

In an alternate embodiment, solder balls 120 in FIG. 3e are reflowed or otherwise pressed into THV 114, without necessarily stacking semiconductor wafers. The single wafer is singulated as described in FIG. 3h.

Figure 4E:
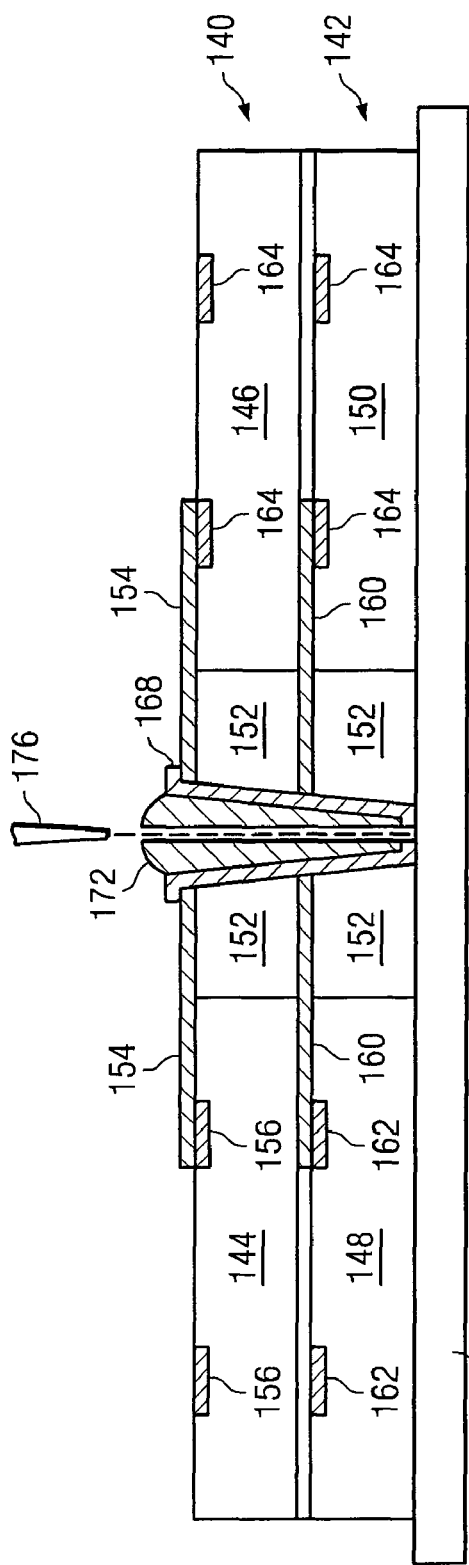

FIGS. 4a-4f illustrate an alternate method of forming conductive vias on a periphery of a semiconductor die in the WLCSP. In FIG. 4a, semiconductor wafers 140 and 142 are stacked one above the other on expansion table 143. Semiconductor wafer 140 includes semiconductor die 144 and 146. Semiconductor wafer 142 includes semiconductor die 148 and 150. The expansion table 143 moves laterally to create an expanded gap in the saw streets between the semiconductor die, as described in FIG. 3b. An organic insulating material 152 is deposited in the gap using spin coating, needle dispensing, or other suitable application process, similar to FIG. 3c. Organic material 152 can be BCB, PI, or acrylic resin. Alternatively, other non-conductive materials such as a polymer molding compound, liquid epoxy molding, compression molding, soft laminating film, or other material having dielectric or electrical insulating properties can be deposited in the gap.

An electrically conductive material 154 is patterned and deposited on the active surfaces of semiconductor die 144 and 146 using an evaporation, electrolytic plating, electroless plating, screen printing, or other suitable metal deposition process. Conductive layer 154 connects to contact pads 156 on die 144 and contacts pads 158 on die 146. Likewise, an electrically conductive material 160 is patterned and deposited on the active surfaces of semiconductor die 148 and 150 using an evaporation, electrolytic plating, electroless plating, screen printing, or other suitable metal deposition process. Conductive layer 160 connects to contact pads 162 on die 148 and contacts pads 164 on die 150. The conductive layers 154 and 160 can be made with Al, Cu, Sn, Ni, Au, Ag, or other suitable material.

In FIG. 4b, a portion of organic material 152 is removed by laser drilling or etching to create THV 166 extending down to expansion table 143. The walls of the remaining portion of organic material 152, which define THV 166, can be vertical or tapered.

In FIG. 4c, an electrically conductive via lining 168 is conformally deposited along the walls of the remaining portion of organic material 152 and bottom of THV 166. Conductive via lining 168 electrically connects to conductive layers 154 and 160. Conductive via lining 168 includes an optional seed layer. The seed layer and conductive via lining 168 are patterned and deposited using a conformal electrolytic plating, electroless plating, CVD, PVD, or other suitable metal deposition process. The seed layer can be made with Cu, Ni, NiV, Au, or Al. The conductive via lining 168 can be made with Al, Cu, Sn, Ni, Au, or Ag. The conformal application of conductive via lining 168 along the walls of the remaining portion of organic material 152 and bottom of THV 166 outlines the conductive via within the gap. The conductive via lining 168 is relatively thin, having a thickness of typically about 2 µm to 50 µm. The conductive layer 154 extends from contact pads 156 and 164 to conductive via lining 168. The conductive layer 160 extends from contact pads 162 and 164 to conductive via lining 168.

An electrically conductive solder bump or ball 170 is deposited over or on top of conductive via lining 168 using pick-and-place, ball drop, solder injection, screen printing, electrolytic plating, electroless plating, CVD, PVD, or other suitable metal deposition process. The solder material can be any metal or electrically conductive material, e.g., Sn, Pb, Ni, Au, Ag, Cu, Bi, and alloys thereof. For example, the solder material can be eutectic Sn/Pb, high lead, or lead free. A flux material may be coated to conductive via lining 168, prior to depositing solder balls 170. The diameter of solder ball 170 is greater than the diameter of THV 166, which ranges from 10-100 μm. Accordingly, solder ball 170 remains on top of THV 166.

The solder balls 170 are reflowed by heating the solder material above its melting point. The solder material flows into THV 166 by capillary action to fill the THV with conductive material 172, as shown in FIG. 4*d*. Conductive via lining 168 provides adhesive enhancement for conductive material 172. In some applications, the solder material is reflowed a second time to improve its electrical contact. In addition, pressure can be applied to force the solder material into THV 166. The combination of conductive materials 168 and 172 constitutes a conductive via 174 formed through the expanded gap in organic material 152 around a peripheral region of the semiconductor die.

Figure 4F:
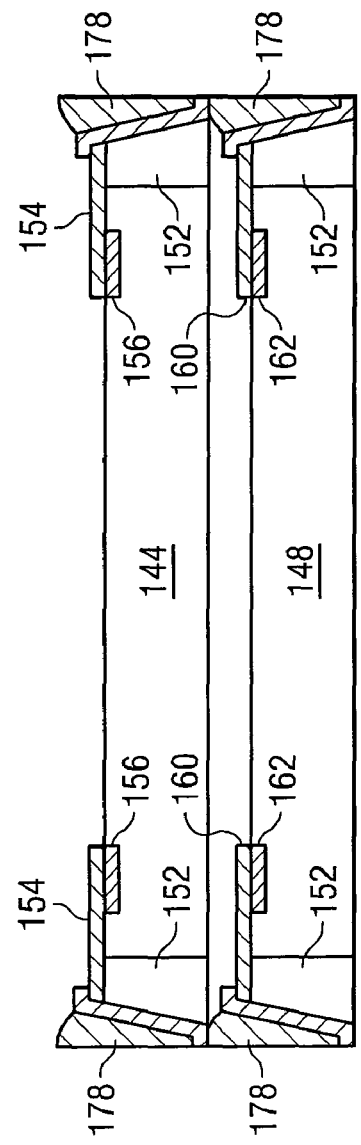

Semiconductor wafers 140 and 142 are singulated in FIG. 4*e* through a center portion of the gap, i.e., through a center portion of THV 166 to bisect conductive material 172 and create conductive half-vias. The gap region is cut by a cutting tool 176 such as a saw blade or laser. The cutting tool completely severs the gap region to separate the die. The semiconductor die are removed from expansion table 143. FIG. 4*f* shows semiconductor die 144 and 148 with conductive half-vias 178 separated from the die by organic material 152.

Figure 5:
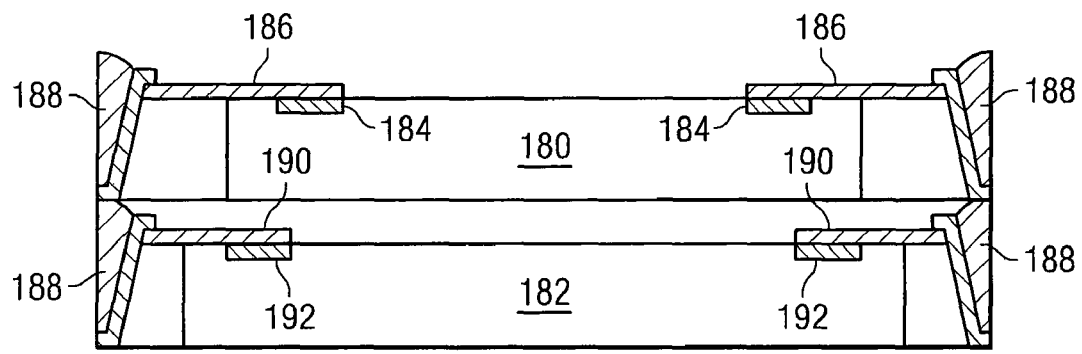
FIG. 5 illustrates vertically stacked semiconductor die in pyramid arrangement with conductive half-vias.

FIG. 5 shows semiconductor die 180 and 182 vertically stacked in a pyramid arrangement. Semiconductor die 180 is smaller than semiconductor die 182. Conductive half-vias 188 are formed according to FIGS. 3*a*-3*i* and provide an electrical connection from one side of each die to the other side of the die. Contact pads 184 of semiconductor die 180 electrically connect through conductive layer 186 to conductive half-vias 188, which in turn electrically connect through conductive layer 190 to contact pads 192 of semiconductor die 182.

Figure 6:
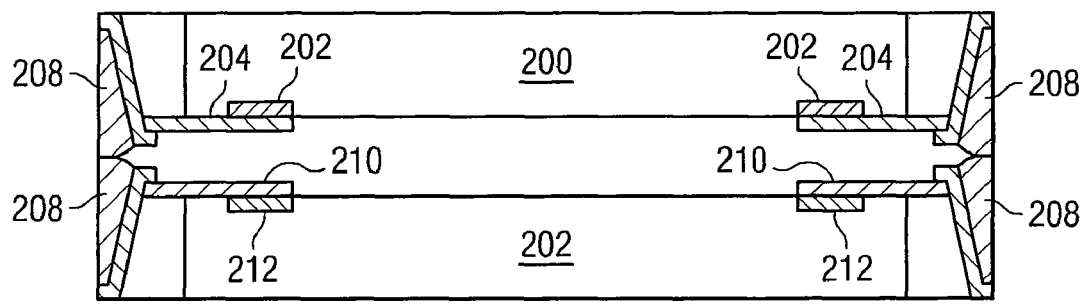
FIG. 6 illustrates vertically stacked semiconductor die in back-to-back arrangement with conductive half-vias.

FIG. 6 shows semiconductor die 200 and 202 vertically stacked in a face-to-face arrangement. Conductive half-vias 208 are formed according to FIGS. 3*a*-3*i* and provide an electrical connection from one side of each die to the other side of the die. Contact pads 202 of semiconductor die 200 electrically connect through conductive layer 204 to conductive half-vias 208, which in turn electrically connect through conductive layer 210 to contact pads 212 of semiconductor die 202.

Figure 7:
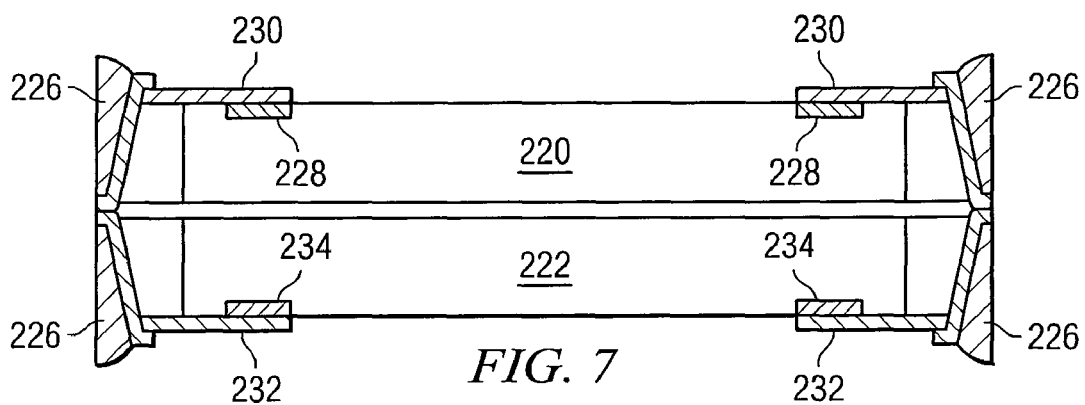
FIG. 7 illustrates vertically stacked semiconductor die in face-to-face arrangement with conductive half-vias.

FIG. 7 illustrates semiconductor die 220 and 222 vertically stacked in a back-to-back arrangement. Conductive half-vias 226 are formed according to FIGS. 3*a*-3*i* and provide an electrical connection from one side of each die to the other side of the die. Contact pads 228 of semiconductor die 220 electrically connect through conductive layer 230 to conductive half-vias 226, which in turn electrically connect through conductive layer 232 to contact pads 234 of semiconductor die 222.

Figure 8:
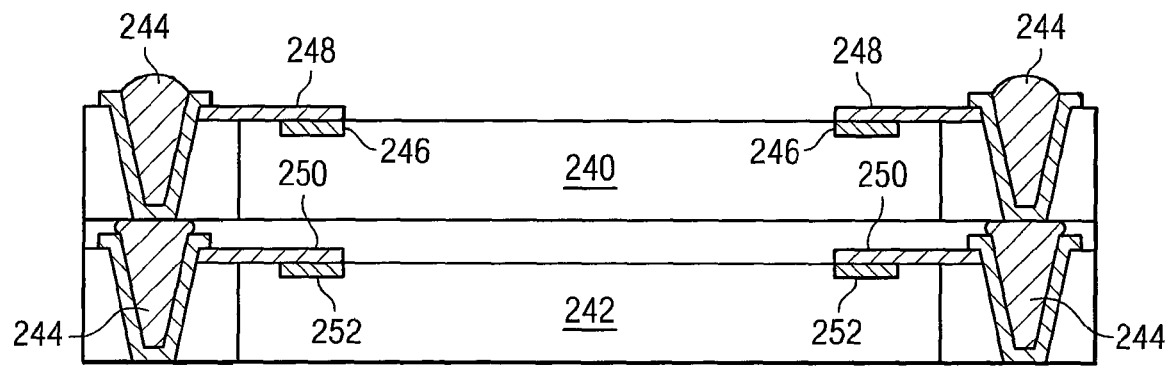
FIG. 8 illustrates vertically stacked semiconductor die with conductive full-vias.

FIG. 8 shows vertically stacked semiconductor die 240 and 242 of the same size. Conductive full-vias 244 provide an electrical connection from one side of each die to the other side of the die. To form full-vias 244, gap 108 is made sufficiently wide to form two side-by-side THVs like 114 in FIG. 3*d*. The gap is filled with organic material 112. The two THVs 114 are separated by organic material 112 in gap 108. Both THVs 114 are lined with conductive material as described in FIG. 3*e*. Conductive via lining 116 includes an optional seed layer. The seed layer and conductive via lining 116 are patterned and deposited using a conformal electrolytic plating, electroless plating, CVD, PVD, or other suitable metal deposition process. The seed layer can be made with Cu, Ni, NiV, Au, or Al. The conductive via lining 116 can be made with Al, Cu, Sn, Ni, Au, or Ag. The conformal application of the conductive via lining 116 along the walls of the remaining portion of organic material 112 and bottom of THVs 114 outlines the conductive via within the gap. The conductive via lining 116 is relatively thin, having a thickness of typically about 2 μm to 50 μm.

Electrically conductive solder bumps or balls 120 are deposited over or on top of each conductive via lining 116 using pick-and-place, ball drop, solder injection, screen printing, electrolytic plating, electroless plating, CVD, PVD, or other suitable metal deposition process. The solder material can be any metal or electrically conductive material, e.g., Sn, Pb, Ni, Au, Ag, Cu, Bi, and alloys thereof. For example, the solder material can be eutectic Sn/Pb, high lead, or lead free. A flux material may be coated to conductive via lining 116, prior to depositing solder balls 120. The diameter of solder balls 120 is greater than the diameter of THVs 114, which ranges from 10-100 μm. Accordingly, solder balls 120 remain on top of both THVs 114. The solder balls 120 are reflowed by heating the solder material above its melting point. The solder material flows into THVs 114 by capillary action to fill both THVs with conductive material 122, as shown in FIG. 3*g*. Conductive via lining 116 provides adhesive enhancement for conductive material 122. The conductive material 122 in each semiconductor wafer bonds to adjacent conductive material 122 in the adjacent semiconductor wafer. In some applications, the solder material is reflowed a second time to improve its electrical contact. In addition, pressure can be applied between the first and second semiconductor wafer to force the solder material into THV 114.

As a result, two side-by-side conductive vias are formed in gap 108, each surrounded by organic material 112. The cutting tool severs organic material 112 between the two conductive vias to provide full-vias 244. Contact pads 246 of semiconductor die 240 electrically connect through conductive layer 248 to conductive full-vias 244, which in turn electrically connect through conductive layer 250 to contact pads 252 of semiconductor die 242.

Figure 9:
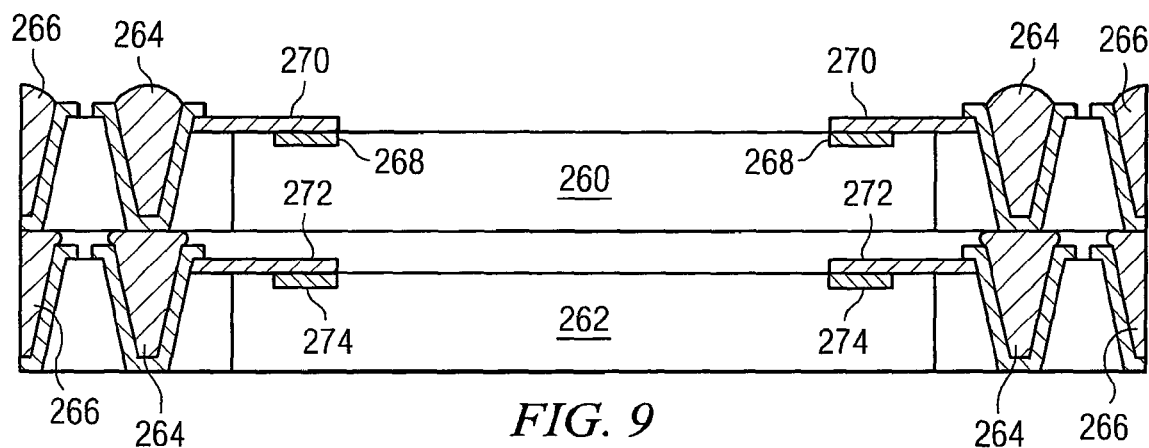
FIG. 9 illustrates vertically stacked semiconductor die with multiple rows of conductive full-vias and half-vias.

FIG. 9 illustrates multiple rows of conductive vias interconnecting vertically stacked semiconductor die 260 and 262. In this case, semiconductor die 260 and 262 use full-vias 264 and half-vias 266. Conductive full-vias 264 are formed according to FIG. 8. Conductive half-vias 266 are formed according to FIGS. 3*a*-3*i*. Conductive full-vias 264 and half-via 266 provide an electrical connection from one side of each die to the other side of the die. Contact pads 268 of semiconductor die 260 electrically connect through conductive layer 270 to conductive full-vias 264, which in turn electrically connect through conductive layer 272 to contact pads 274 of semiconductor die 262.

Figure 10:
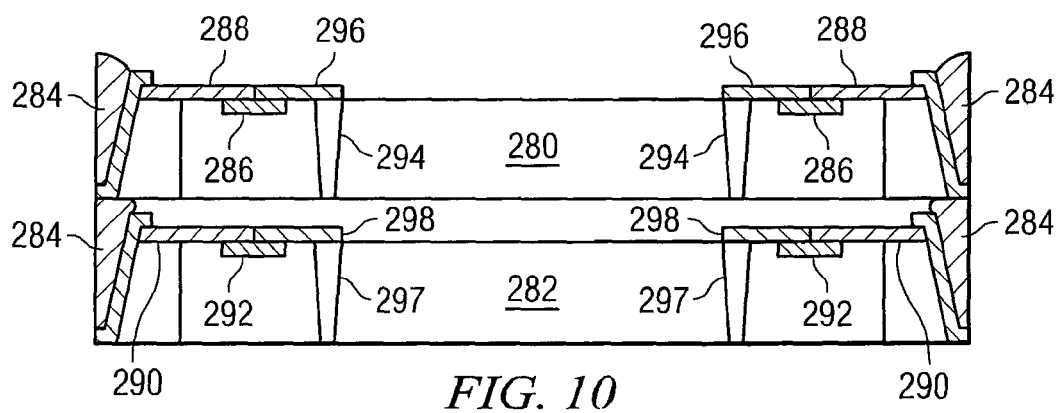
FIG. 10 illustrates vertically stacked semiconductor die with conductive half-vias and conductive through silicon conductive vias.

FIG. 10 shows vertically stacked semiconductor die 280 and 282. Conductive half-vias 284 are formed according to FIGS. 3*a*-3*i* and provide an electrical connection from one side of each die to the other side of the die. Contact pads 286 of semiconductor die 280 electrically connect through conductive layer 288 to conductive half-vias 284, which in turn electrically connect through conductive layer 290 to contact pads 292 of semiconductor die 282. Semiconductor die 280 further includes conductive through silicon via (TSV) 294 electrically connected to contact pads 286 with conductive layers 296. Semiconductor die 282 further includes conductive TSV 297 electrically connected to contact pads 292 with conductive layers 298.

Figure 11:
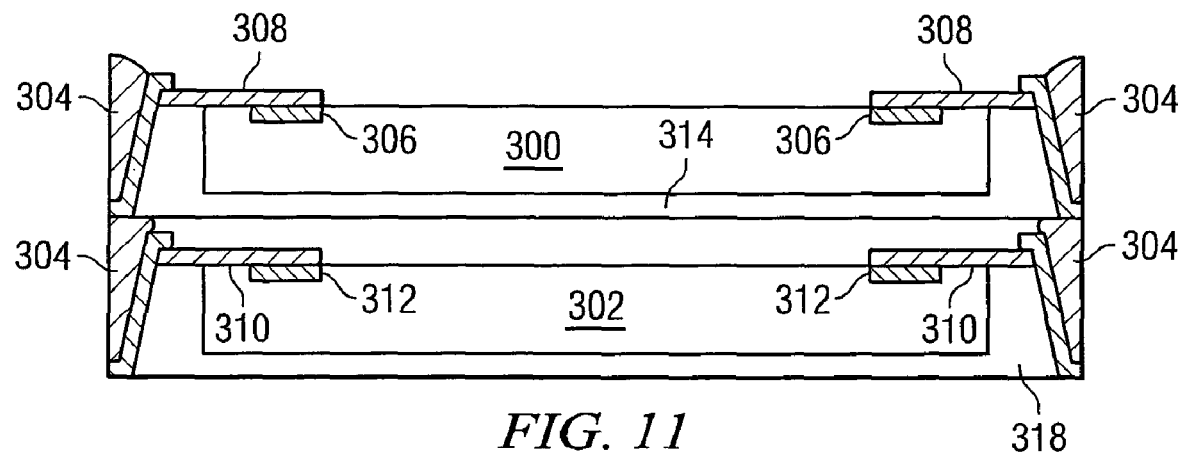
FIG. 11 illustrates vertically stacked semiconductor die with conductive half-vias and organic material disposed under the die.

FIG. 11 illustrates vertically stacked semiconductor die 300 and 302. Conductive half-vias 304 are formed according to FIGS. 3*a*-3*i* and provide an electrical connection from one side of each die to the other side of the die. Contact pads 306 of semiconductor die 300 electrically connect through conductive layer 308 to conductive half-vias 304, which in turn electrically connect through conductive layer 310 to contact pads 312 of semiconductor die 302. Organic material 314 is deposited on the sides and bottom of semiconductor die 300. Organic material 318 is deposited on the sides and bottom of semiconductor die 302. In this embodiment, the backside of semiconductor die 300 and 302 is vertically offset from the bottom of conductive vias 304 so that organic material 314 can be deposited on the backside of semiconductor die 300 and organic material 318 can be deposited on the backside of semiconductor die 302.

Figure 12:
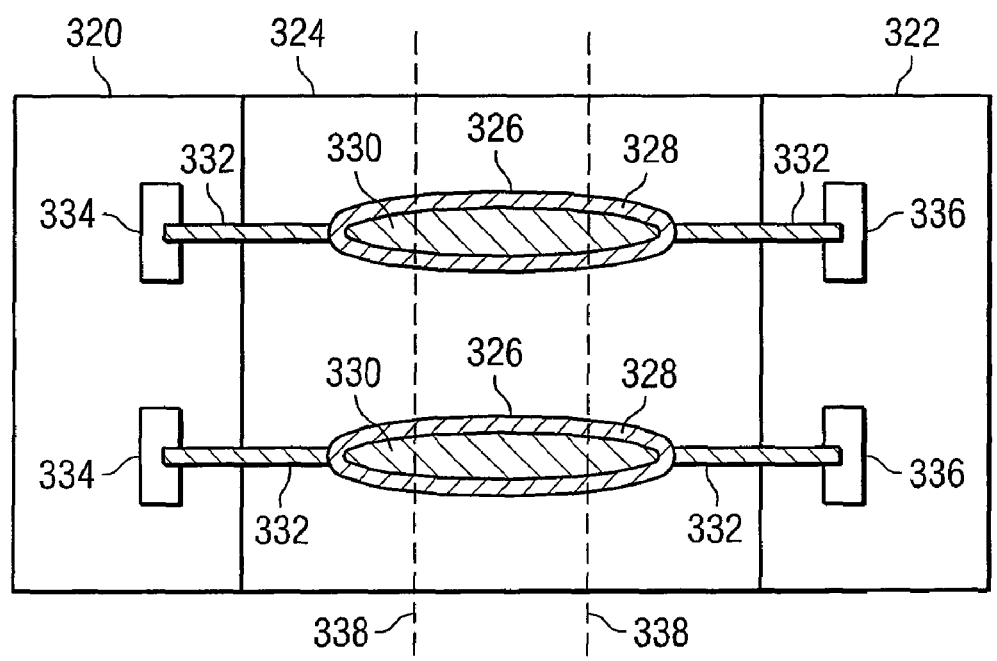
FIG. 12 illustrates a top view of elliptical conductive vias.

FIG. 12 is a top view of semiconductor die 320 and 322 with elliptical conductive vias formed in organic material 324. Elliptical THVs 326 are formed in organic material 324. Conductive via lining 328 is conformally deposited in THVs 326. Solder balls are disposed over THVs 326 and reflowed to fill the THVs with conductive material 330. Conductive layers 332 electrically connect conductive material 330 to contacts pads 334 and 336 on semiconductor die 320 and 322, respectively. Lines 338 show the path of the cutting tool to singulate the die. The width between lines 338 is about 70-80 μm.

Figure 13:
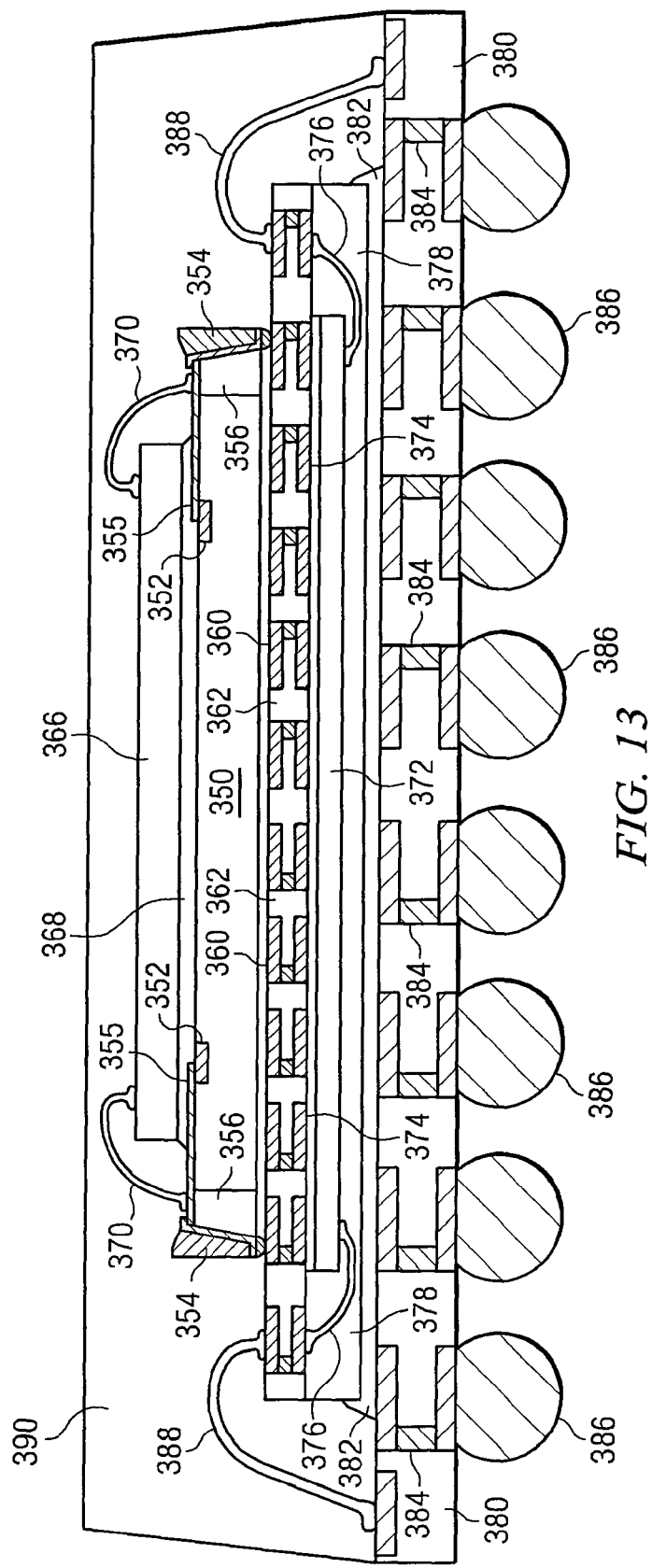
FIG. 13 illustrates a package-in-package with semiconductor die interconnected by conformal conductive vias formed in the saw street.

The aforedescribed semiconductor die with conductive vias formed along the gap can be readily integrated into package-in-package (PiP) applications, as shown in FIG. 13. Semiconductor device 350 has contact pads 352. Contact pads 352 connect to conductive half-vias 354 by way of conductive layer 355. Conductive vias 354 are separated from device 350 by insulating material 356 in the gap of semiconductor die 350. Conductive vias 354 further connect to interconnect structure 360 on substrate 362. Semiconductor device 366 is mounted to semiconductor die 350 using adhesive layer 368. Semiconductor device 366 electrically connects to conductive vias 354 with bond wires 370. Semiconductor device 372 is mounted to a backside of substrate 362 using adhesive layer 374. Semiconductor device 372 electrically connects to interconnect structure 360 with bond wires 376. A molding compound or encapsulant 378 is deposited over semiconductor device 372 and bond wires 376. Molding compound 378 can be made with epoxy acrylate or other polymer material and applied by transfer molding, liquid encapsulant molding, or other molding process. Molding compound 378 is non-conductive and environmentally protects the semiconductor device from external elements and contaminants. In one embodiment, semiconductor devices 350, 366, and 372 are stacked memory devices.

The entire assembly 350-378 is mounted to substrate 380 with adhesive layer 382. An electrically conductive solder material 386 is deposited over interconnect structure 384 on substrate 380 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 386. In some applications, solder bumps 386 are reflowed a second time to improve electrical contact to interconnect structure 384. Bond wires 388 electrically connect interconnect structure 360 on substrate 362 with interconnect structure 384 on substrate 380. An encapsulant or molding compound 390 is formed over semiconductor devices 350 and 366, substrates 362 and 380, and bond wires 370 and 388. Conductive vias 354 perform an integrated part of the electrical interconnection between stacked semiconductor devices 350, 366, and 372 in the PiP.

The semiconductor die with conductive vias formed along the gap can also be integrated into a fan-in package-on-package (Fi-PoP) applications.

The formation of conformal conductive vias uses a fast and simple process. The conformal conductive via lining is a relatively thin layer formed on the sidewalls of the THV. The thin conformal conductive via structure allows the vias to be closely arranged for higher density placement and reduced package size. A high aspect ratio conductive via is achieved by the thin conductive via lining on the sidewalls and bottom of the THVs. The reflow of the solder balls fills the conductive via lining with conductive material to form the conductive vias. No CMP and etching is needed after deposition of the conductive layers. In addition, no bonding agent, e.g., conductive adhesives or solder beads, is required between the conductive vias.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a first semiconductor wafer having a plurality of semiconductor die, each semiconductor die having a contact pad;
   creating a gap between the semiconductor die, the gap having sufficient width to form a conductive via within the gap;
   depositing an insulating material in the gap;
   forming a conductive layer over the semiconductor die, the conductive layer being electrically connected to the contact pad of the semiconductor die;
   removing a portion of the insulating material to form a through hole via (THV);
   conforming a conductive lining in the THV;
   disposing a solder material above the conductive lining of the THV;
   reflowing the solder material to form the conductive via within the gap, the conductive via being electrically connected to the conductive layer; and
   singulating the first semiconductor wafer through the gap to separate the semiconductor die.

2. The method of claim 1, further including:
   stacking a second semiconductor wafer having a plurality of semiconductor die over the first semiconductor wafer, the second semiconductor wafer having a gap between the semiconductor die;
   forming a conductive via in the gap of the second semiconductor wafer; and
   aligning the conductive via in the first semiconductor wafer to the conductive via in the second semiconductor wafer.

3. The method of claim 1, further including:
   stacking a plurality of semiconductor die; and
   electrically interconnecting the plurality of semiconductor die through the conductive vias.

4. The method of claim 3, wherein the plurality of semiconductor die are stacked in a pyramid arrangement.

5. The method of claim 3, wherein the plurality of semiconductor die are stacked in a face-to-face, back-to-back, or face-to-back arrangement.

6. The method of claim 3, wherein the plurality of semiconductor die are substantially the same size.

7. The method of claim 1, further including forming a through silicon via under the contact pad of the semiconductor die.

8. The method of claim 1, further including depositing the insulating material on a backside of the semiconductor die opposite the contact pad.

* * * * *